(12) United States Patent
von Kaenel

(10) Patent No.: US 8,493,088 B2
(45) Date of Patent: Jul. 23, 2013

(54) DYNAMIC VOLTAGE AND FREQUENCY MANAGEMENT

(75) Inventor: Vincent R. von Kaenel, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 37 days.

(21) Appl. No.: 13/360,038

(22) Filed: Jan. 27, 2012

(65) Prior Publication Data
US 2012/0119777 A1 May 17, 2012

Related U.S. Application Data

(60) Continuation of application No. 13/032,052, filed on Feb. 22, 2011, now Pat. No. 8,130,009, which is a division of application No. 12/361,405, filed on Jan. 28, 2009, now Pat. No. 7,915,910.

(51) Int. Cl.
*H03K 19/00* (2006.01)
(52) U.S. Cl.
USPC ..................................... 326/16; 326/9; 326/33
(58) Field of Classification Search
USPC ............................................ 326/9, 14–16, 33
See application file for complete search history.

(56) References Cited

U.S. PATENT DOCUMENTS

| | | |
|---|---|---|
| 5,440,520 A | 8/1995 | Schutz et al. |
| 5,682,118 A | 10/1997 | Kaenel et al. |
| 5,712,589 A | 1/1998 | Afek et al. |
| 5,856,766 A | 1/1999 | Gillig et al. |
| 6,078,634 A | 6/2000 | Bosshart |
| 6,154,095 A | 11/2000 | Shigemori et al. |
| 6,157,247 A | 12/2000 | Abdesselem et al. |
| 6,188,252 B1 | 2/2001 | Kawakami |
| 6,366,157 B1 | 4/2002 | Abdesselem et al. |
| 6,535,056 B2 | 3/2003 | Mizuno |
| 6,664,775 B1 | 12/2003 | Clark et al. |
| 6,762,629 B2 | 7/2004 | Tam et al. |

(Continued)

FOREIGN PATENT DOCUMENTS

| | | |
|---|---|---|
| JP | 60-83344 | 5/1985 |
| JP | 10-326867 | 12/1998 |
| WO | 98/06022 | 2/1998 |

OTHER PUBLICATIONS

Notice of Preliminary Rejection and translation thereof in related Korean Patent Application No. 10-2011-7019203, Mar. 27, 2013, pp. 1-7.

(Continued)

*Primary Examiner* — Anh Tran
(74) *Attorney, Agent, or Firm* — Lawrence J. Merkel; Meyertons, Hood, Kivlin, Kowert & Goetzel PC

(57) ABSTRACT

In one embodiment, an integrated circuit includes a self calibration unit configured to iterate a test on a logic circuit in the integrated circuit at respectively lower supply voltage magnitudes until the test fails. A lowest supply voltage magnitude at which the test passes is used to generate a requested supply voltage magnitude for the integrated circuit. In an embodiment, an integrated circuit includes a series connection of logic gates physically distributed over an area of the integrated circuit, and a measurement unit configured to launch a logical transition into the series and detect a corresponding transition at the output of the series. The amount of time between the launch and the detection is used to request a supply voltage magnitude for the integrated circuit.

20 Claims, 12 Drawing Sheets

U.S. PATENT DOCUMENTS

| | | | |
|---|---|---|---|
| 6,809,606 | B2 | 10/2004 | Wong et al. |
| 6,828,848 | B2 | 12/2004 | Lee |
| 6,874,083 | B2 | 3/2005 | Sarangi et al. |
| 6,903,964 | B2 | 6/2005 | Naha et al. |
| 7,071,768 | B2 | 7/2006 | Abe et al. |
| 7,084,710 | B2 | 8/2006 | Huang et al. |
| 7,276,925 | B2 | 10/2007 | Dobberpuhl et al. |
| 7,319,358 | B2 | 1/2008 | Senthinathan et al. |
| 7,652,494 | B2 | 1/2010 | Dobberpuhl et al. |
| 7,898,285 | B2 | 3/2011 | Bernstein et al. |
| 7,915,910 | B2 | 3/2011 | von Kaenel |
| 7,928,747 | B2 | 4/2011 | Dobberpuhl et al. |
| 2002/0135343 | A1 | 9/2002 | Underbrink et al. |
| 2003/0018937 | A1 | 1/2003 | Athavale |
| 2003/0206071 | A1 | 11/2003 | Wong et al. |
| 2004/0139358 | A1 | 7/2004 | Elbe et al. |
| 2005/0188230 | A1 | 8/2005 | Bilak |
| 2005/0206463 | A1 | 9/2005 | Godambe et al. |
| 2005/0283630 | A1 | 12/2005 | Shikata |
| 2006/0074576 | A1 | 4/2006 | Patel et al. |
| 2006/0259840 | A1 | 11/2006 | Abadeer et al. |
| 2008/0082873 | A1* | 4/2008 | Russell et al. ............... 714/721 |
| 2008/0282102 | A1 | 11/2008 | Reddy et al. |
| 2008/0297233 | A1 | 12/2008 | Tokunaga |
| 2009/0016140 | A1 | 1/2009 | Qureshi et al. |
| 2009/0287944 | A1* | 11/2009 | Bilak ............................ 713/322 |

OTHER PUBLICATIONS

Vincent von Kaenel, et al., "A Voltage Reduction Technique for Battery-Operated System," IEEE Journal of Solid-State Circuits, vol. 25, No. 5, Oct. 1990, 5 pages.

Christopher Poirier, et al., "Power and Temperature Control on a 90nm Itanium-Family Processor," 2005 IEEE International Solid-State Circuits Conference, 2 pages.

Tim Fischer, et al., "A 90nm Variable-Frequency Clock System for a Power-Managed Itanium-Family Processor," 2005 IEEE INternational Solid-State Circuits Conference, 3 pages.

"CVD Circuit and Operation," ISSCC 2005, Paper 16.2, ISSCC Visuals Supplement, p. 617.

"Impact of Double Switch Scheme," ISSCC 2005, Paper 16.7, ISSCC Visuals Supplement, p. 623.

U.S. Appl. No. 11/753,853, filed May 25, 2007.

Office Action from U.S. Appl. No. 12/634,373, mailed on Aug. 5, 2010, 11 pages.

Search Report from PCT/US2010/021840 mailed on May 12, 2010, 7 pages.

International Search Report and Written Opinion for PCT/US2010/021840, mailed May 27, 2011, 18 pages, Apple Inc.

Office Action from U.S. Appl. No. 13/046,103, mailed May 23, 2011, Apple Inc., all pages.

Office Action and translation thereof in RU Application No. 2011135836, Jan. 9, 2013, pp. 1-13.

Decision to Grant and translation thereof from the Russian Federal Service on Intellectual Property for Application No. 2011140312/08 (060249), issued Feb. 8, 2013; pp. 1-15.

Translation of Office Action in related Japanese Patent Application No. 2011-548143, Apr. 10, 2013, pp. 1-2.

* cited by examiner

DYNAMIC VOLTAGE AND FREQUENCY MANAGEMENT

This application is a continuation of U.S. patent application Ser. No. 13/032,052, filed Feb. 22, 2011, now U.S. Pat. No. 8,130,009 which is a divisional of U.S. patent application Ser. No. 12/361,405, filed Jan. 28, 2009, now U.S. Pat. No. 7,915,910.

BACKGROUND

1. Field of the Invention

This invention is related to integrated circuits and, more particularly, to dynamic voltage and frequency management in an integrated circuit.

2. Description of the Related Art

As the number of transistors included on a single integrated circuit "chip" has increased and as the operating frequency of the integrated circuits has increased, the management of power consumed by an integrated circuit has continued to increase in importance. If power consumption is not managed, meeting the thermal requirements of the integrated circuit (e.g. providing components required to adequately cool the integrated circuit during operation to remain within thermal limits of the integrated circuit) may be overly costly or even infeasible. Additionally, in some applications such as battery powered devices, managing power consumption in an integrated circuit may be key to providing acceptable battery life.

Power consumption in an integrated circuit is related to the supply voltage provided to the integrated circuit. For example, many digital logic circuits represent a binary one and a binary zero as the supply voltage and ground voltage, respectively (or vice versa). As digital logic evaluates during operation, signals frequently transition fully from one voltage to the other. Thus, the power consumed in an integrated circuit is dependent on the magnitude of the supply voltage relative to the ground voltage. Reducing the supply voltage generally leads to reduced power consumption, but also impacts the speed at which digital circuits operate and thus may cause incorrect operation at a given operating frequency (that is, the frequency at which digital logic in the integrated circuit is clocked) or may reduce performance.

Additionally, as transistor geometries have continued to decrease in size, leakage currents that occur when a transistor is not actively conducting current have become a larger component of the power consumed in the integrated circuit. The amount of leakage current experienced in a given transistor generally increases linearly as the supply voltage increases. Additionally, at each new semiconductor fabrication process node (in which the transistor geometries decrease), the leakage current increases more than the active (ON) current. Thus, as more advanced process nodes are used, the leakage current becomes a larger and larger issue.

Thus, power consumption in an integrated circuit may be managed by lowering the supply voltage to the integrated circuit, but incorrect operation may also result if the supply voltage is reduced too far. The supply voltage magnitude at which incorrect operation occurs for a given operating frequency varies on part-by-part basis for a given integrated circuit design. For example, variations in the integrated circuit manufacturing process used to manufacture the integrated circuit and the operating temperature of the integrated circuit may both impact the supply voltage magnitude at which incorrect operation occurs. Accordingly, attempts to manage power consumption via the supply voltage have been limited to supply voltage magnitudes that ensure correct operation at the given frequency across all acceptable variations in the manufacturing process and all permissible operating temperatures. Typically, the supply voltage for a given frequency is statically specified in the integrated circuit's specification.

SUMMARY

In an embodiment, an integrated circuit comprises a logic circuit, a local power manager coupled to the logic circuit, and a self calibration unit. The local power manager is configured to transmit an indication of a requested supply voltage magnitude to an external power supply. The self calibration unit is configured to execute a test on the logic circuit, and to iterate the test at respectively lower requested supply voltage magnitudes until the test fails. A lowest requested supply voltage magnitude at which the test passes is used to generate the requested supply voltage magnitude for operation of the integrated circuit.

In an embodiment, a method comprises iterating a test on a logic circuit by a self calibration unit at respectively lower requested supply voltage magnitudes for an integrated circuit that includes the logic circuit and the self calibration unit until the test fails. The method further comprises the self calibration unit determining a lowest requested supply voltage magnitude at which the test passes. The method still further comprises the self calibration unit selecting the lowest requested supply voltage magnitude to generate the requested supply voltage magnitude for operation of the integrated circuit.

In an embodiment, an integrated circuit comprises a plurality of logic gates physically distributed over an area of the integrated circuit that is occupied by a logic circuit that implements the operation of the integrated circuit, wherein the plurality of logic gates are connected in series; and a measurement unit coupled to a first gate in the series and a last gate in the series. The measurement unit is configured to launch a logical transition into the first gate and to measure time until a corresponding transition is detected from the last gate. The measured time is compared to a predetermined time to adjust a supply voltage of the integrated circuit. In some embodiments, the predetermined time may be determined during a self-calibration procedure. In some embodiments, the predetermined time may be measured as a number of clock cycles that it takes for the pulse to travel through all the gates in series.

In an embodiment, a method comprises a measurement unit launching a logical transition into a first gate of a series connection of a plurality of gates and that are physically distributed over an area of an integrated circuit that is occupied by a logic circuit that implements the operation of the integrated circuit; and the measurement unit measuring a time until a corresponding transition is detected from the last gate, wherein the measured time is compared to a predetermined time to adjust a supply voltage of the integrated circuit.

BRIEF DESCRIPTION OF THE DRAWINGS

The following detailed description makes reference to the accompanying drawings, which are now briefly described.

Figure 1:
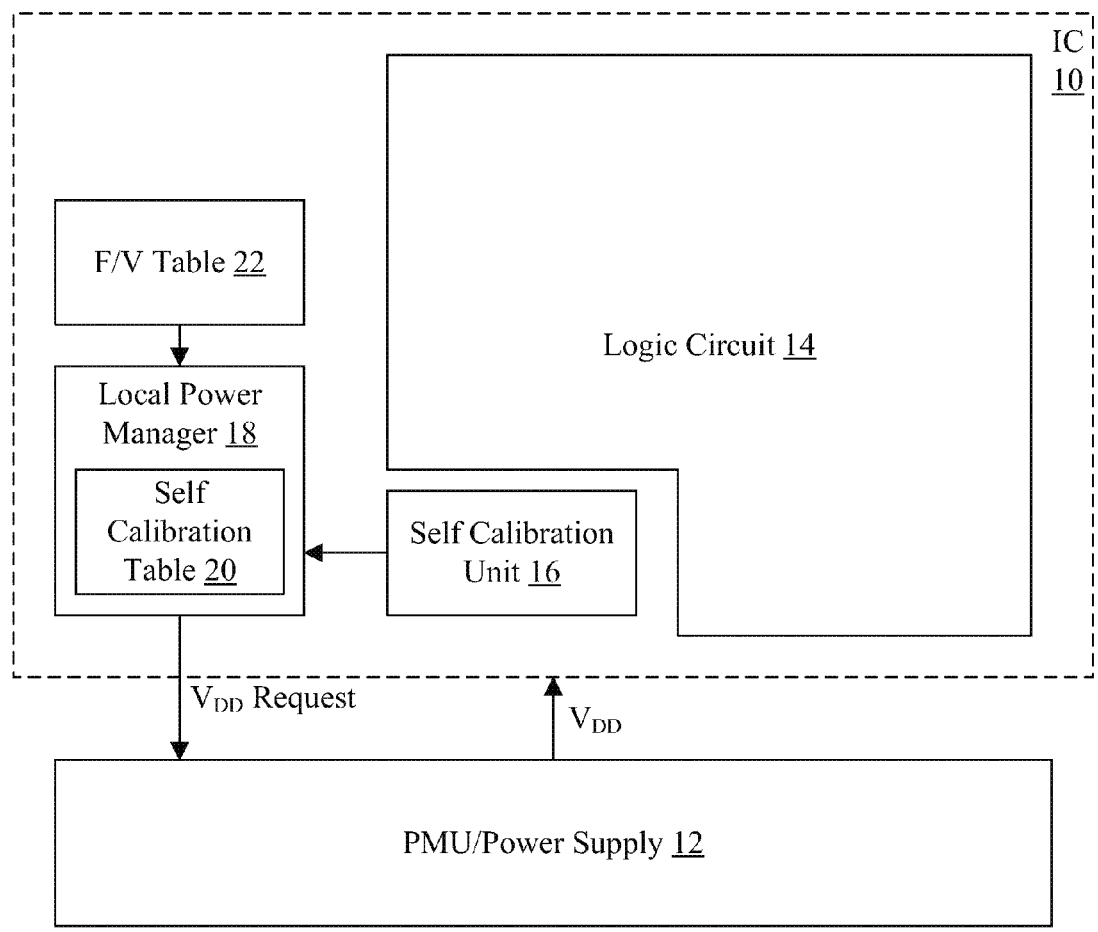
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit 10 coupled to an external power management unit (PMU)/power supply 12 is shown. In the illustrated embodiment, the integrated circuit 10 includes a logic circuit 14, a self calibration unit 16, a local power manager 18 (which may include a self calibration table 20), and a frequency/voltage (F/V) table 22. The self calibration unit 16 and the F/V table 22 are coupled to the local power manager 18, which is coupled to transmit an indication of a requested supply voltage magnitude ($V_{DD}$ request) to the PMU/power supply 12. The PMU/power supply 12 is coupled to provide a supply voltage ($V_{DD}$) of the requested magnitude to the integrated circuit 10. The components illustrated within the integrated circuit 10 are integrated onto a single semiconductor substrate, or chip.

Generally, the self calibration unit 16 comprises control circuitry along with a test that is to be executed by the logic circuit 14. The test may be intended to exercise known "critical" timing paths in the logic circuit 14. A critical timing path may be a path through the circuitry that is expected to exhibit the highest delay (as compared to other timing paths) from input transition to corresponding output transition, and thus would be a path that limits the operating frequency at which the logic circuit 14 will operate correctly. The nature of the test may vary depending on the definition of the logic circuit 14. For example, if the logic circuit 14 includes one or more processor cores, the test may comprise a software program that is to be executed by the processor core(s), along with an expected result from the program (e.g. a signature). If the logic circuit 14 includes fixed-function circuitry, the test may include input signal values and expected output signal values. A combination of signal values and program instructions may be included, in various embodiments.

The circuitry in the self calibration unit 16 may be configured to execute the test on the logic circuit 14 (e.g. supplying the instructions to the processor core(s) for execution, and/or driving the signals with the input signal values). The circuitry in the self calibration unit may also be configured to check the result against the expected value. The self calibration unit 16 may be configured to iterate the test, and to communicate with the local power manager 18 to request lower supply voltage magnitudes for each iteration, until an incorrect result is detected for an iteration. The lowest supply voltage magnitude for which the correct result of the test is detected may be provided as the supply voltage magnitude to request (or some margin may be added to the lowest supply voltage magnitude to arrive at the magnitude to be requested). The self calibration unit 16 may iterate the test for each possible operating frequency, or may perform the test for a given operating frequency in response to the first time that the given operating frequency is actually requested for the integrated circuit 10 (e.g. by software).

By using the self calibration unit 20, in some embodiments, a smaller margin may be used since the self calibration occurs with the integrated circuit 10 installed in the particular device in which it will be deployed (and thus some factors that are to be accounted for with margin, such as variation in the power supply 12, the board design, the package of the integrated circuit 10, etc.) are relatively fixed. Additionally, rather than testing for the lowest possible supply voltage at manufacturing test, fewer supply voltage magnitudes may be tested at that time and thus manufacturing test time may be reduced, in some embodiments. Additionally, the self calibration unit 16 may be activated at any time, thus automatically adjusting for aging effects in the integrated circuit 10, in some embodiments.

In one embodiment, the local power manager 18 may store the resulting supply voltage magnitudes provided by the self calibration unit 16 in the self calibration table 20. The self calibration table 20 may be a random access memory, clocked storage devices such as registers, or any other volatile memory. Alternatively, non-volatile memory such as programmable read-only memory, flash memory, etc. may be used. Thereafter, if an entry in the self calibration table 20 is detected for a given operating frequency, the supply voltage magnitude recorded in the entry may be requested by the local power manager 18.

The F/V table 22 may comprise a plurality of entries, each storing a respective operating frequency for the integrated circuit 10 and a corresponding supply voltage magnitude for that frequency. The frequency of operation may be the frequency for the clock that is supplied to the clocked storage devices in the logic circuit 14. There may be a set of frequencies at which the integrated circuit 10 may operate (and switching between the frequencies in the set may be supported by the integrated circuit 10, e.g. to permit power management, thermal management, etc.). The F/V table 22 may be a static table written during manufacturing test of the integrated circuit 10 (e.g. prior to packaging the integrated circuit, such as at wafer test). In other embodiments, the test may be performed at any point prior to selling the integrated circuit 10 for inclusion in a device, or prior to including the integrated circuit 10 in such a device. In still other embodiments, the F/V table 22 may be written during a self calibration that may be performed prior to using a device including the integrated circuit 10 for the first time. Thus, the supply voltage magnitude determined for each frequency in the F/V table 22 may have significant guardbanding associated with it to ensure correct operation in the event that the package's electrical characteristics change the voltage magnitude, to account for thermal variation (e.g. the test may be performed at a controlled temperature, and the operating temperature may be higher or lower than that temperature), to account for aging effects in the integrated circuit over its expected life, etc.

The local power manager 18 comprises circuitry that is configured to request a supply voltage magnitude from the external power supply (e.g. the PMU/power supply 12). As mentioned previously, if an entry in the self calibration table 20 is detected for a given operating frequency, the local power manager 18 may request the supply voltage magnitude recorded in that entry. If no entry is found in the self calibration table 20, the local power manager 18 may read the F/V table 22 for the given operating frequency and may request that supply voltage magnitude from the PMU/power supply 12 ($V_{DD}$ request in FIG. 1). The request may be represented in any desired fashion. For example, the request may comprise a plurality of bits, with various supply voltage magnitudes within a range of supported magnitudes each assigned a different encoding of the plurality of bits.

The local power manager 18 may also be configured to control the change between operating frequencies. For example, the local power manager 18 may include a register or other facility that can be written by software to select a new operating frequency. The local power manager 18 may detect the write, and may manage the transition from the current operating frequency to the newly requested operating frequency. The transition may include changing the requested supply voltage, changing the operation of clocking circuitry (e.g. relocking a phase locked loop (PLL) that generate the clocks on the integrated circuit 10, etc.), etc. Thus, the details of the transition may be abstracted from software, which may simply request the new frequency and continue (e.g. without even checking to see if the transition has completed), in one embodiment.

The F/V table 22 may be written in any desired fashion. For example, each entry in the table may comprise fuses that may be selectively blown to permanently store an indication in the entry of the desired voltage magnitude (e.g. encoded as a plurality of bits in the entry). Any other non-volatile storage may be used, in other embodiments. The F/V table 22 may comprise a non-volatile memory that may be written via an update to the firmware of the device that includes the integrated circuit 10.

In some embodiments, the test that is executed by the self calibration unit 16 may be programmable, and may be updated. Such embodiments may permit the test to be changed as more data becomes available. For example, a path other than the previously-identified critical paths may dominate, or strongly affect, the supply voltage at which the integrated circuit 10 operates correctly. The test may be updated to include the newly discovered critical path. Still further, the test may be updated to include a more pertinent program to execute during the test, in some embodiments.

The logic circuit 14 may generally include the circuitry that implements the operation for which the integrated circuit 10 is designed. For example, if the design includes one or more processors, the logic circuit 14 may include the circuitry that implements the processor operation (e.g. instruction fetch, decode, execution, and result write). The processors may include general purpose processors and/or graphics processors in various embodiments. If the design includes a bridge to a peripheral interface, the logic circuit 14 may include the circuitry that implements the bridge operation. If the design includes other communication features such as packet interfaces, network interfaces, etc., the logic circuit 14 may include circuitry implementing the corresponding features. The integrated circuit 10 may generally be designed to provide any set of operations. Generally, the logic circuit 14 may comprise any combination of one or more of the following: memory arrays, combinatorial logic, state machines, flops, registers, other clocked storage devices, custom logic circuits, etc.

The PMU/power supply 12 may generally include any circuitry that is capable of generating a supply voltage of a magnitude indicated by an input voltage request. The circuitry may include one or more voltage regulators or other power sources, for example. The PMU/power supply 12 may also include power management circuitry for the system (that includes the integrated circuit 10) as a whole.

While the above discussion has referred to requesting a supply voltage magnitude, and the PMU/power supply 12 supplying a voltage of the requested magnitude, the discussion is not meant to imply that there is only one requested/supplied voltage. There may be multiple supply voltages requested and supplied at any given point in time. For example, there may be separate supply voltages for combinatorial logic circuitry and for memory circuitry in the logic circuit 14. There may be multiple voltage domains within the integrated circuit 10 that may be powered up and down separately, and each domain may include a separate request. The local power manager 18 may be powered separate from the logic circuit 14. Any set of one or more supply voltages may be requested and supplied.

The magnitude of the supply voltage has been referred to above as being requested, and the supply voltage of the requested magnitude being supplied. The magnitude of the supply voltage may be measured with respect to a reference (e.g. the ground of the integrated circuit 10, sometimes referred to as $V_{SS}$). For convenience in the description below, voltages may be referred to as being greater than or less than other voltages. Similarly, measurement of a voltage may be referred to herein. In such cases, it is the magnitude of the voltage that is greater than (or less than) the other voltage, or that is measured.

Figure 2:
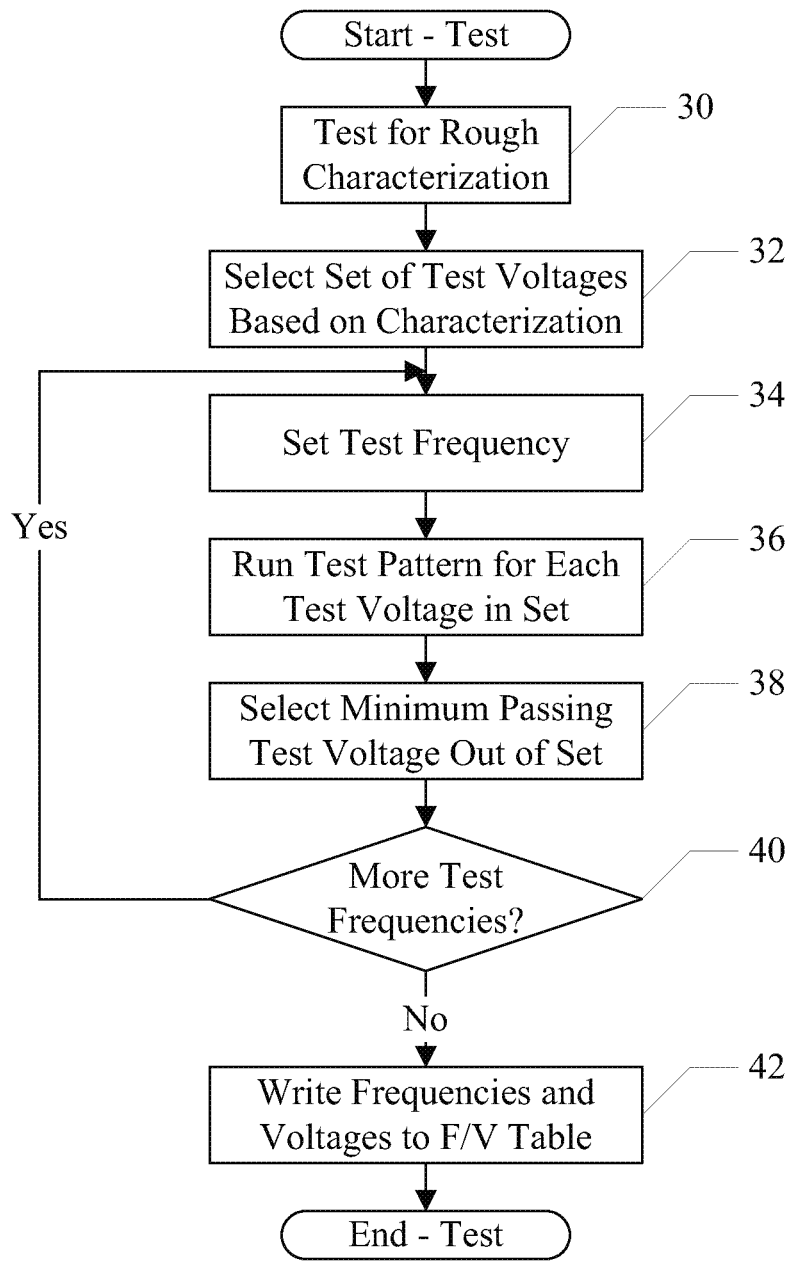
FIG. 2 is a flowchart illustrating one embodiment of a test of the integrated circuit shown in FIG. 1.

Turning now to FIG. 2, a flowchart is shown illustrating one embodiment of testing integrated circuit 10 shown in FIG. 1 prior to packaging the integrated circuit. The blocks shown in FIG. 2 may be performed on a test machine (e.g. a wafer tester) during the manufacture of the integrated circuit 10.

Figure 12:
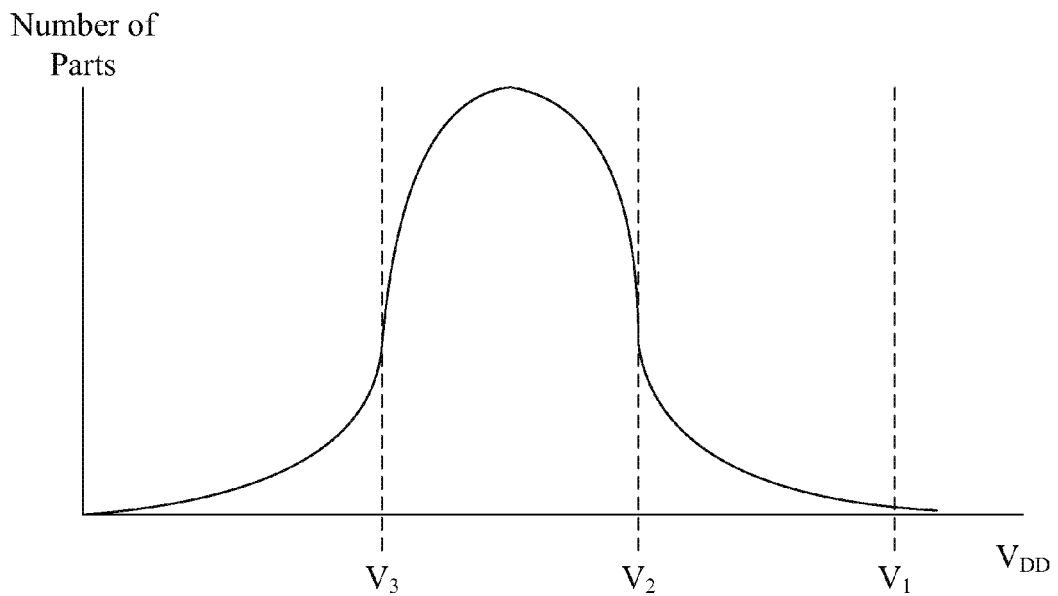
FIG. 12 is a graphical representation of the number of parts that are operable at various supply voltages and the test voltages that may be used in one embodiment of testing the integrated circuit.

The test may begin by testing for a rough characterization of the integrated circuit 10 (block 30), using various measurements to estimate whether the integrated circuit is relatively fast, relatively slow, etc. For example, in one embodiment the rough characterization may include testing the current into the integrated circuit 10 while the integrated circuit 10 is quiescent (often referred to as "$I_{ddq}$" testing). Higher $I_{ddq}$ measurements may indicate higher leakage (e.g. a "faster" process). Lower $I_{ddq}$ measurements may indicate lower leakage (e.g. a "slower" process). The $I_{ddq}$ testing may be performed, e.g., with the supply voltage set to the maximum value permissible for the integrated circuit 10. From the rough characterization (and from the previous results of testing instances of the integrated circuit 10), a relatively small set of test supply voltages may be selected. That is, based on supply voltages that provide reliable operation on previous parts having similar rough characterizations, a small set of test voltages may be selected (block 32). For example, a set of three test voltages may be selected, in one embodiment. FIG. 12 is a graphical representation of the distribution of parts from fast process (left side of FIG. 12) to slow process (right side of FIG. 12). The test voltages for one example may be $V_1$, $V_2$, and $V_3$ as illustrated in FIG. 12.

The test machine may power up the integrated circuit 10 (e.g. with the highest of the test voltages) and may set the test frequency (one of the frequencies at which operation of the integrated circuit 10 is supported—block 34). The test machine may run one or more test patterns on the integrated circuit 10 for each of the set of test voltages (block 36) and may select the lowest test voltage for which all of the test patterns pass (i.e. the correct result is achieved for each pattern—block 38). If there are more test frequencies (e.g. more supported operating frequencies for the integrated circuit 10 that have not yet been tested—decision block 40, "yes" leg), the next frequency may be selected and tested (blocks 34, 36, and 38). The set of test voltages may include different voltages to be tested for each supported operating frequency, or may be selected so that at least one passing supply voltage is expected for each supported operating frequency. Once the test frequencies have been exhausted (decision block 40, "no" leg), the test machine may write the frequencies and voltage magnitudes to the F/V table 22 (block 42). For example, fuses may be blown to represent the supported frequencies and corresponding supply voltage magnitudes.

Since the number of test voltages is limited, the test process may not identify the lowest supply voltage that would result in correct operation of the particular instance of the integrated circuit 10. However, time on the test machine may be limited, which can be important in general and especially if the integrated circuit 10 is expected to be manufactured in high volumes.

Figure 3:
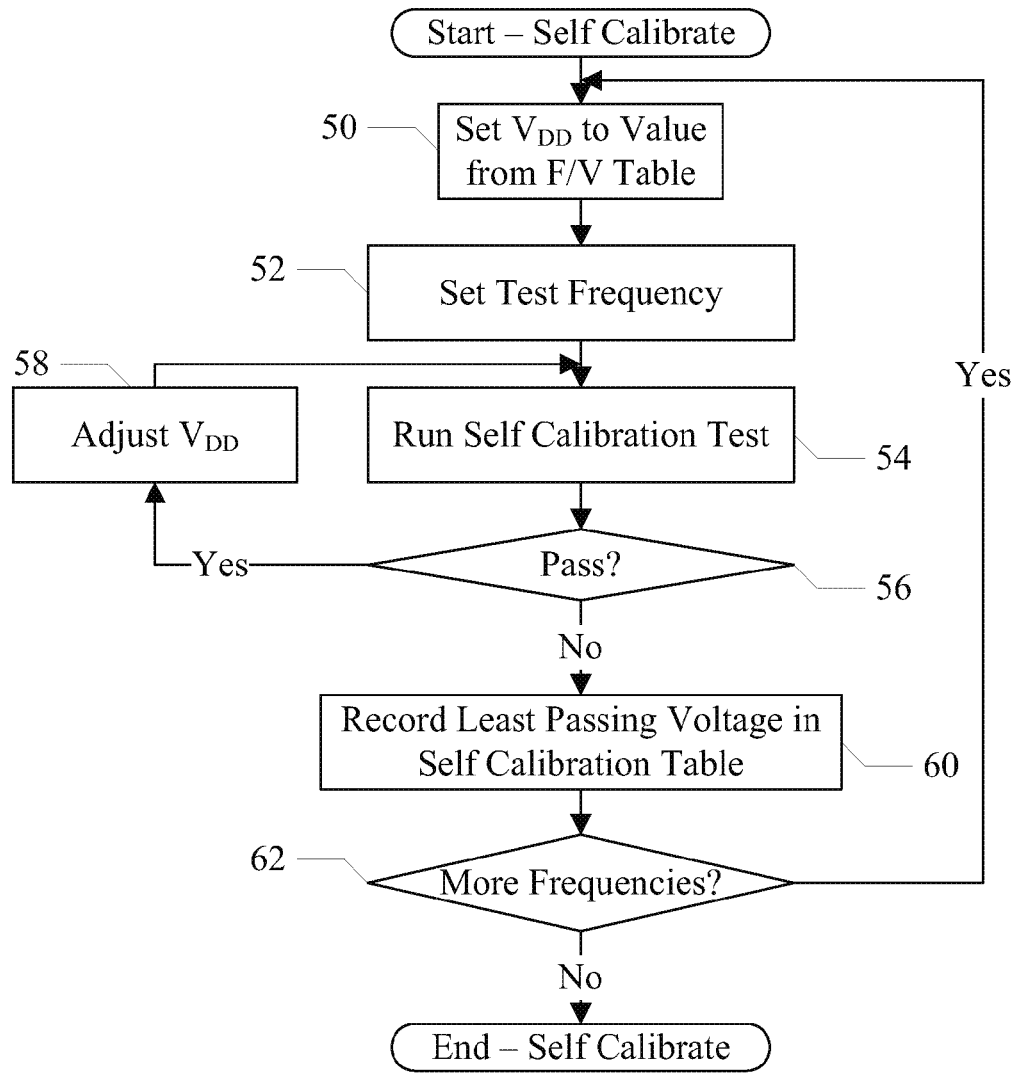
FIG. 3 is a flowchart illustrating operation of one embodiment of a self calibrate unit shown in FIG. 1.

Turning next to FIG. 3, a block diagram illustrating operation of one embodiment of the self calibration unit 16 (and the local power manager 18) to perform a self calibration. The self calibration may be performed at various times, as discussed in more detail below. While the blocks are shown in a particular order for ease of understanding, other orders may be used. Blocks may be performed in parallel in combinatorial logic circuitry within the self calibration unit 16 and/or the local power manager 18. Blocks, combinations of blocks, and/or the flowchart as a whole may be pipelined over multiple clock cycles.

The self calibration unit 16 may communicate to the local power manager 18 to indicate that the self calibration process is being performed. Alternatively, the local power manager 18 may initiate the self calibration process and may thus be aware that self calibration is in process. In either case, the local power manager 18 may request the supply voltage magnitude that is provided in the F/V table 22 for the test frequency (block 50). Each operating frequency that is supported by the integrated circuit 10 may be a test frequency, e.g. beginning with the lowest frequency. The local power manager 18 may set the test frequency (block 52), and may wait for the integrated circuit to stabilize on the test frequency (e.g. PLL lock time and/or the settling time for the voltage from the PMU/power supply 12). The self calibration unit 16 may run the self calibration test (block 54) and determine if the logic circuit 14 produces the correct result (a pass) or not (a fail) (decision block 56). If the test passes (decision block 56, "yes" leg), the self calibration unit 16 may inform the local power manager 18, which may request the next lower supply voltage (block 58) and the test may be performed again (blocks 54 and 56). The test may be iterated until a fail result is detected for the test (blocks 54, 56, and 58). Once a fail is detected (decision block 56, "no" leg), the local power manager 18 may record the magnitude of the lowest passing supply voltage in the self calibration table 20 (block 60). In some embodiments, a margin may be added to the lowest passing supply voltage to arrive at the voltage magnitude to be recorded in the self calibration table. Alternatively, the margin may be added when requesting the supply voltage. If there are more test frequencies to be self calibrated (decision block 62, "yes" leg), the self calibration process returns to block 50 for the next frequency. Otherwise (decision block 62, "no" leg), the self calibration process ends.

Figure 4:
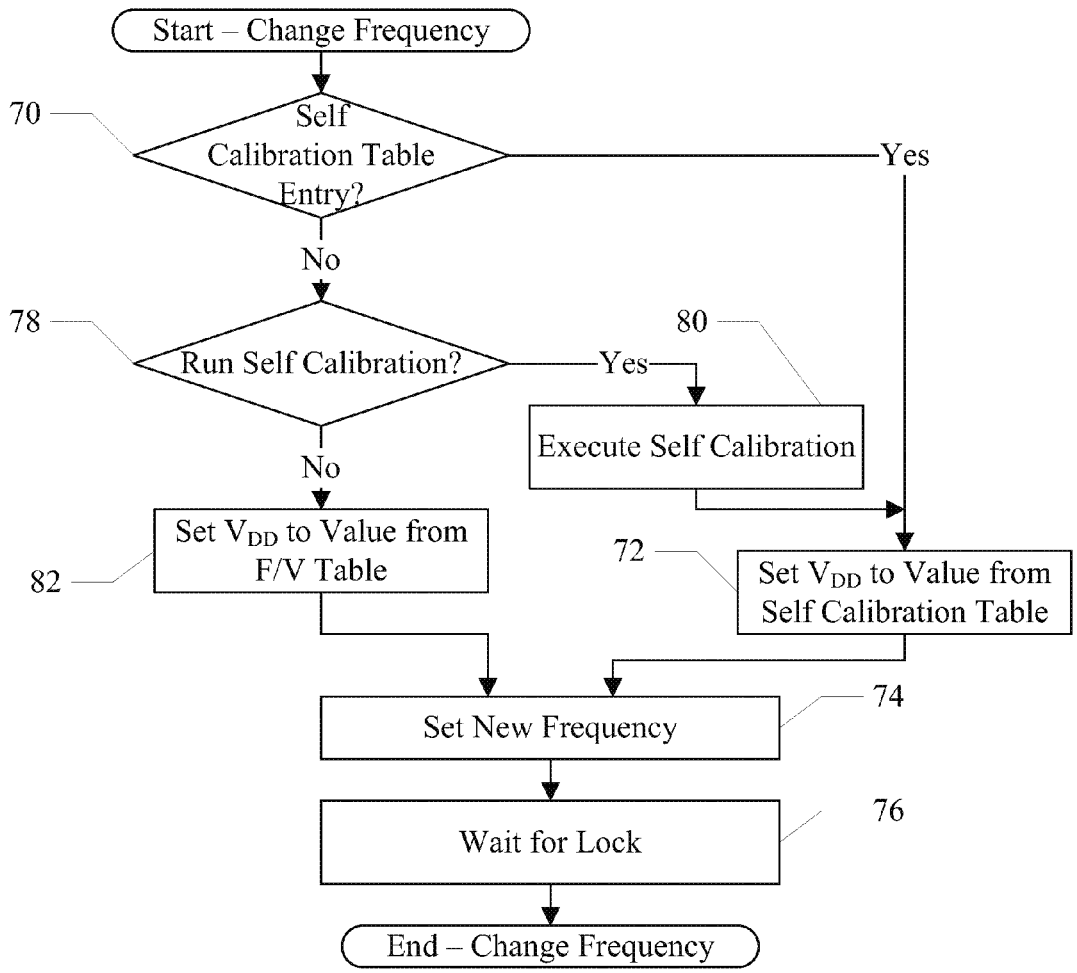
FIG. 4 is a flowchart illustrating operation of one embodiment of the integrated circuit shown in FIG. 1 to change a frequency of operation of the integrated circuit.

Turning now to FIG. 4, a flowchart is shown illustrating operation of one embodiment of the local power manager 18 in response to a request to change the operating frequency (e.g. from software executing on the integrated circuit 10 or elsewhere in the system that includes the integrated circuit 10). While the blocks are shown in a particular order for ease of understanding, other orders may be used. Blocks may be performed in parallel in combinatorial logic circuitry within the local power manager 18. Blocks, combinations of blocks, and/or the flowchart as a whole may be pipelined over multiple clock cycles.

The local power manager 18 may check the self calibration table 20 for an entry corresponding to the new (requested) operating frequency (decision block 70). If an entry is found (decision block 70, "yes" leg), the local power manager 18 may request the supply voltage of the magnitude indicated in the self calibration table 20 (block 72). The local power manager 18 may set the new operating frequency (block 74), and may optionally wait for the clocking circuitry to lock to the new operating frequency, depending on the implementation (block 76). On the other hand, if there is no entry in the self calibration table 20 for the requested frequency (decision block 70, "no" leg), the local power manager 18 may determine if self calibration should be run for the requested frequency (decision block 78). For example, the flowchart of FIG. 3 may be performed with the requested frequency as the only test frequency. Factors that may affect whether or not to perform self calibration during the frequency change may include the current workload of the logic circuit 14, the overall environment in the system (e.g. temperature, battery life remaining, etc.). For example, if the logic circuit 14 includes multiple processor cores and one of the cores is idle, self calibration may be run on the idle processor core. If the system is operating on battery power and the battery life remaining is low, running the self calibration may drain more battery power than desired.

If the local power manager 18 determines that self calibration is to be executed (decision block 78, "yes" leg), the local power manager 18 may invoke the self calibration unit 16 to perform the self calibration (block 80). The local power manager 18 may then request the supply voltage indicated in the self calibration table 20 (after completion of the self calibration—block 72), set the new operating frequency (block 74), and optionally wait for lock (block 76).

If the local power manager 18 determines that self calibration is not to be executed (decision block 78, "no" leg), the local power manager 18 may read the F/V table 22 to obtain the supply voltage magnitude, and may request that supply voltage magnitude (block 82). The local power manager 18 may set the new frequency, and optionally wait for lock (blocks 74 and 76).

Figure 5:
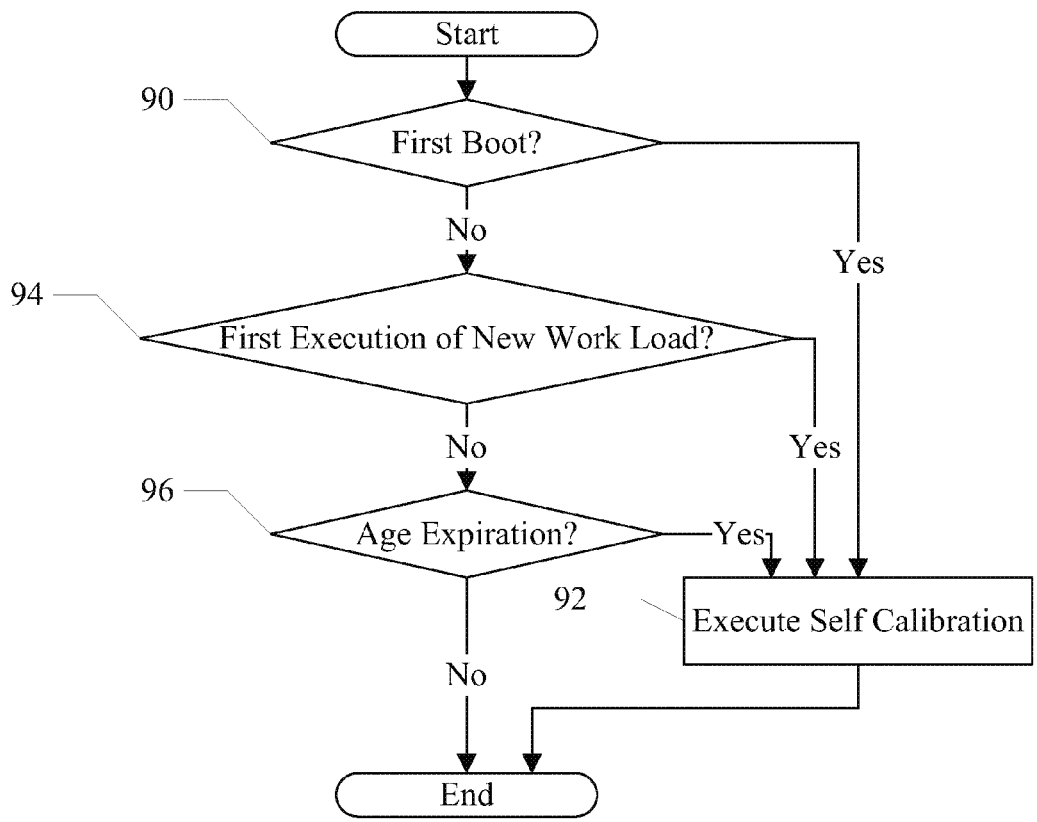
FIG. 5 is a flowchart illustrating performance of self calibration in response to various events, for one embodiment.

In the embodiment of FIG. 4, self calibration may be performed in response to a requested operating frequency for which an entry in the self calibration table 20 is not found. In addition to or instead of this operation, self calibration may be invoked at one or more other points in time (e.g. as shown in the flowchart of FIG. 5, for one embodiment). The flowchart shown in FIG. 5 may be implemented in hardware, in software, and/or a combination thereof.

If the system that includes the integrated circuit 10 is being booted for the first time (e.g. by the customer who purchased the system—decision block 90, "yes" leg), the integrated circuit 10 may execute self calibration (block 92). Generally, booting a system may refer to powering the system on and initializing the system to begin operation. The determination that the boot is the first boot of the system may be made in a variety of fashions. For example, there may be a flag stored in a non-volatile memory in the system that may indicate whether or not this system is being booted for the first time. The flag may be checked by boot code in the system, and the flag's state may be changed at the end of the boot code if the boot is the first boot, so that subsequent boots may not be detected as the first boot. For example, the flag may be a bit that is clear initially, and is set after the first boot (or vice versa). In some embodiments, a full system reset (e.g. a hard reset initiated by a user activating one or more inputs to the device) may clear the "first boot" flag and cause self calibration to occur on the next boot. Such operation may, in some embodiments, improve functionality of the device. For example, if the user initiates a hard reset because the device is "frozen" or otherwise malfunctioning, the self calibration may alleviate the error if the error is due to malfunction in the integrated circuit 10 (e.g. due to a self calibration supply voltage magnitude that is too low). Additionally, if the device is connected to a network (e.g. the Internet), an updated calibration program or procedure may be downloaded to the device automatically from the device manufacturer. The self calibration may be executed in response to the update.

Alternatively or in addition, the system may determine that a given workload is being executed for the first time (decision block 94, "yes" leg), and may execute the self calibration in response (block 92). Determining that a given workload is being executed for the first time may be implemented in a variety of fashions (e.g. a flag for each workload in non-volatile storage, similar to the discussion above regarding first boot). Detecting different workloads may be used, e.g., in a system in which the workloads vary significantly. For example, the system may be a mobile device that may function as a mobile phone, a music player, a web browser, and may perform various other computing tasks. The workloads may differ substantially, and may require different amounts of performance from the integrated circuit 10. Accordingly, self calibrating each workload may results in additional power savings (e.g. a lighter load may result in a lower operating temperature, which may permit a lower supply voltage magnitude than heavier workloads would permit).

In yet another alternative or addition, the system may determine that it has aged by a certain amount (decision block 96, "yes" leg), and may execute self calibration in response (block 92). Performing self calibration in response to aging of the integrated circuit 10 (and/or the device that includes the integrated circuit 10) may adjust the requested supply voltage magnitudes for the integrated circuit 10 to compensate for chip process aging effects or other aging effects. In this fashion, margin need not be added to the requested supply voltage magnitude to account for aging effects (since it is already accounted for by recalibrating as the integrated circuit 10 ages). Age of the integrated circuit 10 may be measured in a variety of fashions. For example age may be measured from the date of the first boot, based on calendar time. Age may be measured in terms of time of operation from the first boot. Age may be measured in terms of time, or in terms of clock cycles, as desired. Age may also be measured relative to date of manufacture, in other embodiments. In either case, the self calibration may be performed at multiple different ages (e.g. once every 6 months, once a year, etc.). In still other cases, self calibration may be performed dynamically while the system is in operation, which may help compensate for temperature effects. Any desired set of self calibration invocations may be implemented in various embodiments.

Figure 6:
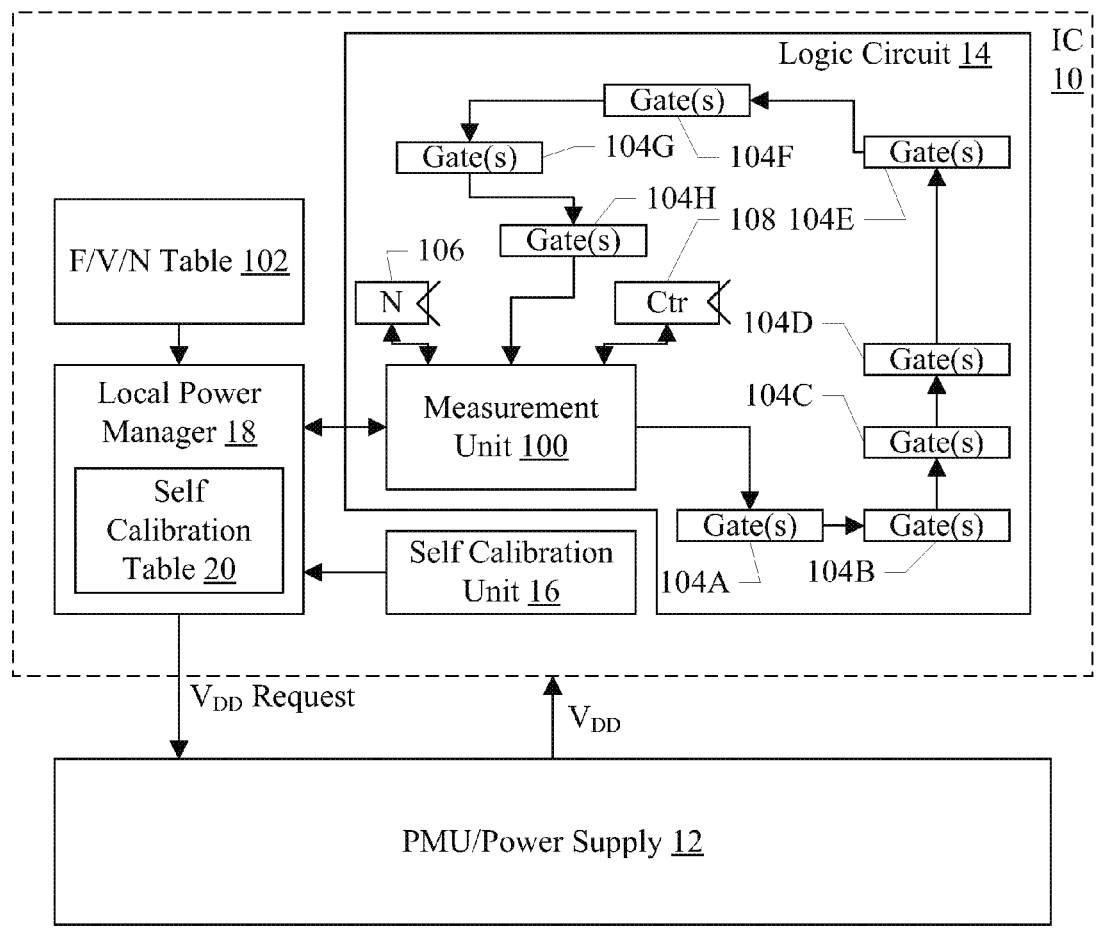
FIG. 6 is a block diagram of another embodiment of the integrated circuit.

Turning now to FIG. 6, a block diagram of another embodiment of the integrated circuit 10 and the PMU/power supply 12 is shown. Similar to the embodiment of FIG. 1, the embodiment of the integrated circuit 10 in FIG. 6 includes the logic circuit 14 and the local power manager 18. In some embodiments, the self calibration unit 16 and the self calibration table 20 may be included, but other embodiments may not include these features. In the embodiment of FIG. 6, the F/V table 22 from FIG. 1 is replaced by and F/V/N table 102 coupled to the local power manager 18. The F/V/N table 102 may include entries storing the frequency and corresponding supply voltage magnitudes, similar to the F/V table 22. In addition, the entries may store a delay measurement (N) described in more detail below. As further illustrated in the embodiment of FIG. 6, the integrated circuit 10 may include a measurement unit 100 and logic gates 104A-104H coupled in series. An input to logic gate(s) 104A is coupled to the measurement unit 100, and an output of logic gate(s) 104H is coupled to the measurement unit 100 as well. Additionally, a flop 106 stores an expected delay measurement (N) and a flop 108 stores a counter value (Ctr). Both flops 106 and 108 are coupled to the measurement unit 100. The flops 106 and 108 may be any clocked storage devices, in other embodiments.

The measurement unit 100 may be configured to measure a propagation delay of a logical transition through the series connection of gates 104A-104H. The gates 104A-104H may have the same design as the various logic gates in the logic circuit 14. Accordingly, the propagation delay through the gates 104A-104H should be proportional to the logic gates in the logic circuit 14. By measuring the propagation delay and comparing it to a predetermined delay, the effects of various factors on the operation of the logic circuit 14 may be accounted for. For example, the effect of operating temperature, aging, etc. may be detected by measuring the propagation delay and comparing it to the predetermined amount.

The propagation delay may be measured in any desired units (e.g. nanoseconds, clock cycles, etc.). In one embodiment, the propagation delay is measured in terms of clock cycles at the current operating frequency of the clock supplied to the logic circuit 14. Accordingly, the measurement unit 100 may launch a logical transition (e.g. a zero to one or a one to zero transition) into the input of the series connection of gates 104A-104H (i.e. the input of gates 104A in FIG. 6) and may count clock cycles until the corresponding transition is detected at the output of the series connection (i.e. the output of gates 104H in FIG. 6). In one embodiment, a pulse comprising two logical transitions (e.g. zero to one and back to zero again) may be transmitted. The counter Ctr in flop 108 may be cleared when the logical transition is launched and may be incremented each clock cycle until the corresponding transition is detected. The flop 106 may store the predetermined number of clock cycles (N) that are expected to occur if the supply voltage is providing a delay that supports the current operating frequency. If the measured number of clock cycles is higher than the predetermined number N, the supply voltage may be increased to lower the delay. If the measured number of clock cycles is lower than the predetermined number N, the supply voltage may be decreased to increase the delay (and consume less power).

The number of gates in the series connection may be significantly larger than the number of gate delays that may evaluate within a clock cycle of the clock supplied to the logic circuit 14. For example, the number of gates in series may be approximately 100 times the number of gate delays in a clock cycle. Thus, if 14 gate delays are available in the clock cycle, about 1400 gates may be in series in the gates 104A-104H. Using a large number of gates may improve the matching of the measured delay to the circuit delay actually occurring in the logic circuit 14. Additionally, because the present embodiment counts the delay in terms of clock cycles, the large number of gates may reduce the measurement error that occurs due to the clock cycle granularity. For example, at 100 times the number of gate delays in a clock cycle, an error of one full clock cycle in the delay (the maximum possible error) is only 1% of the measurement. While 100 is used in this embodiment, other embodiments may use larger or smaller numbers (e.g. 200, 500, 100, 50, etc.).

The predetermined number N may be measured during manufacturing test of the integrated circuit. The predetermined number N is generally expected to be close the multiple of the number of gate delays used to create the series connection of gates (e.g. 100 in the above example), but may vary somewhat from the number. In one embodiment, the predetermined number N may be stored in the F/V/N table 102 along with the static supply voltage magnitude for a given operating frequency. There may be one N stored in the table, or there may be one N for each operating frequency (in the entry corresponding to that operating frequency) in various embodiments.

The gates 104A-104H may be physically distributed over the area of the integrated circuit 10 that is occupied by the logic circuit 14. Accordingly, variations in process characteristics and/or operating temperature that may occur over the surface area of the integrated circuit chip may be represented in the propagation delay. That is, each set of one or more gates 104A-140H may be affected by the operating temperature and/or process characteristics that are local to the physical area in which those gates 104A-104H are located. In one embodiment, the gates 104A-104H may be selected from the "spare gates" that are typically included throughout an integrated circuit 10 in order to permit repairing logic errors in the logic circuit 14 by changing the wiring layers of the integrated circuit. That is, the spare gates are not initially wired into the logic circuit 14, and are not used. If errors in the logic are detected, the spare gates can be wired into the logic circuit 14 to generate the correct logic function. A variety of different logic gates may be included in the spare gates to increase the probability that the correct logic function can be generated. Accordingly, unused spare gates may have the variety, and may be wired together to create a series connection of gates 104A-104H that may scale similar to the logic circuit 14. By implementing the gates 104A-104H out of the spare gates, the gates 104A-104H may not add to the semiconductor area consumed by the integrated circuit 10.

Additionally, the use of a series connection of logic gates 104A-104H to sense delay is primarily a digital circuit. Thus, the use of the circuit may be relatively simple and low power, as compared to analog circuitry, in some embodiments.

The measurement unit 100 comprises at least the circuitry configured to launch the transition and to measure the propagation delay. In some embodiments, the measurement unit 100 may also include circuitry configured to determine when to take the measurement and/or the circuitry configured to compare the propagation delay to the expected value. Alternatively, the determination may be made in the local power manager 18 or in software.

Generally, a logic gate comprises circuitry that receives one or more inputs and is configured to perform a logic function on the inputs to provide one or more outputs. One or more such gates may be included in each set of gates 104A-104H. It is noted that, while the gates 104A-104H appear near the periphery of the logic circuit 14 in FIG. 6 for convenience in the drawing, the gates may generally be interspersed through the logic circuit 14 area, as mentioned above.

While the above discussion of FIG. 6 has referred to requesting a supply voltage magnitude, and the PMU/power supply 12 supplying a voltage of the requested magnitude, the discussion is not meant to imply that there is only one requested/supplied voltage. There may be multiple supply voltages requested and supplied at any given point in time. For example, there may be separate supply voltages for combinatorial logic circuitry and for memory circuitry in the logic circuit 14. There may be multiple voltage domains within the integrated circuit 10 that may be powered up and down separately, and may have separate measurement units and serial chains of logic gates. Each such domain may include a separate request. The local power manager 18 may be powered separate from the logic circuit 14. Any set of one or more supply voltages may be requested and supplied. Furthermore, in some embodiments, more than one chain of gates may be implemented within a voltage domain to model different types of delays. For example, logic gate delays and register file delays may be modeled separately.

Figure 7:
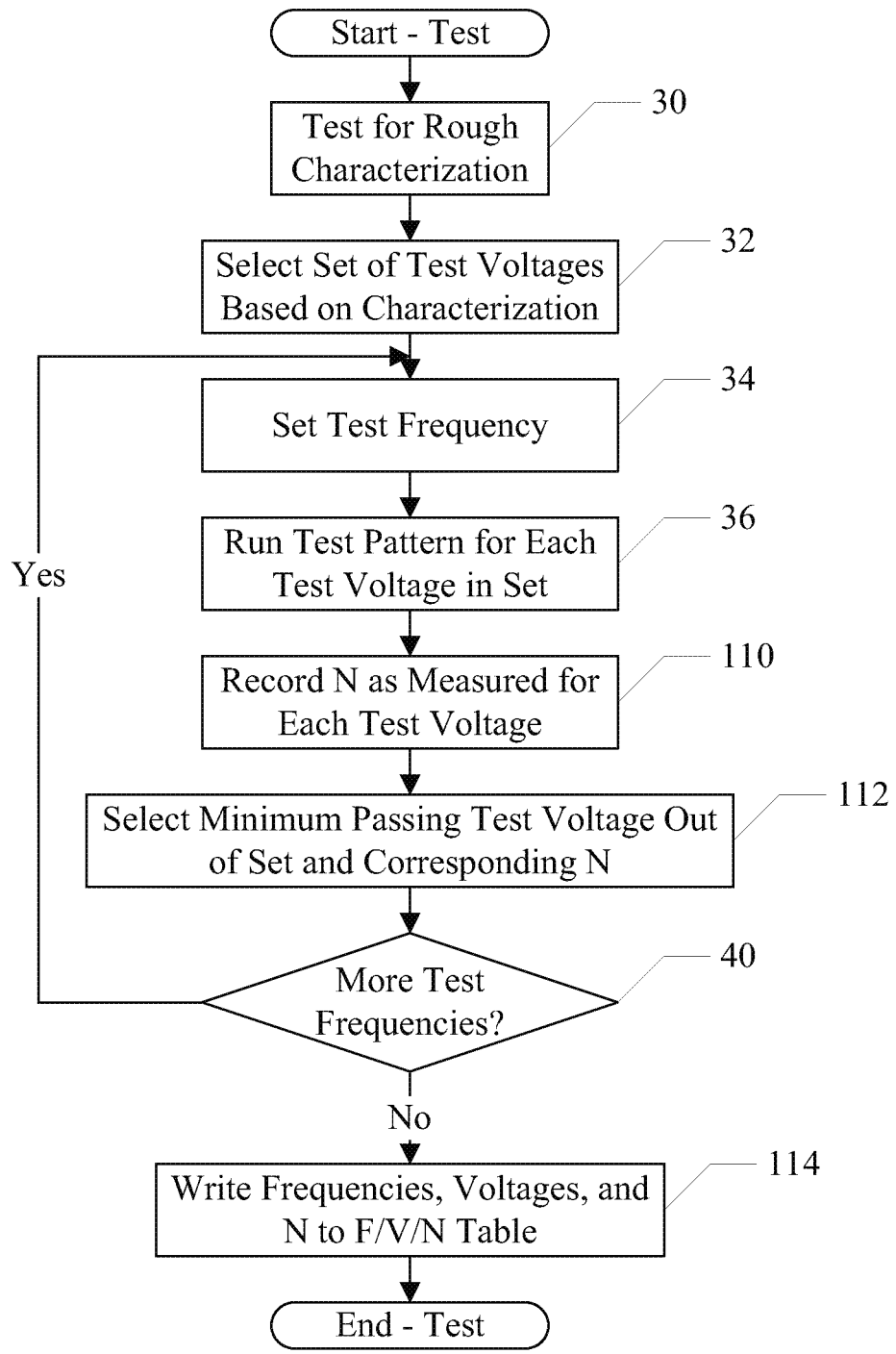
FIG. 7 is a flowchart illustrating one embodiment of a test of the integrated circuit shown in FIG. 6.

Turning now to FIG. 7, a flowchart is shown illustrating one embodiment of testing integrated circuit 10 as shown in FIG. 6 prior to packaging the integrated circuit. The blocks shown in FIG. 7 may be performed on a test machine (e.g. a wafer tester) during the manufacture of the integrated circuit 10.

Similar to the embodiment of FIG. 2, the test may begin by testing for a rough characterization of the integrated circuit 10 (block 30), such as $I_{ddq}$ testing, and a set of test voltages may be selected (block 32). The tester may set a first test frequency (block 34), and may run a test pattern for each voltage in set of test voltages as the supply voltage (block 36). In this embodiment, the test may include activating the measurement unit 100. For each test voltage, the tester may read the number of clock cycles of delay "N" as measured by the measurement unit 100 during the test (that is, the value in the counter flop 108). The tester may record the measured N for each test voltage (block 110). The tester may then select the minimum supply voltage magnitude for which the test passes, as well as the corresponding "N" (block 112).

If there are more test frequencies (e.g. more supported operating frequencies for the integrated circuit 10 that have not yet been tested—decision block 40, "yes" leg), the next frequency may be selected and tested (blocks 34, 36, 110, and 112). The set of test voltages may include different voltages to be tested for each supported operating frequency, or may be selected so that at least one passing supply voltage is expected for each supported operating frequency. Once the test frequencies have been exhausted (decision block 40, "no" leg), the test machine may write the frequencies, voltage magnitudes, and values of "N" to the F/V/N table 102 (block 114).

In some embodiments, a margin may be added to the measured "N" to be written to the table. Alternatively, the margin may be added to "N" read from the table to write "N" to the flop 106. Similarly, a margin may be added to the supply voltage magnitude written to the table or the margin may be added by the local power manager 18 after reading the magnitude from the table.

Figure 8:
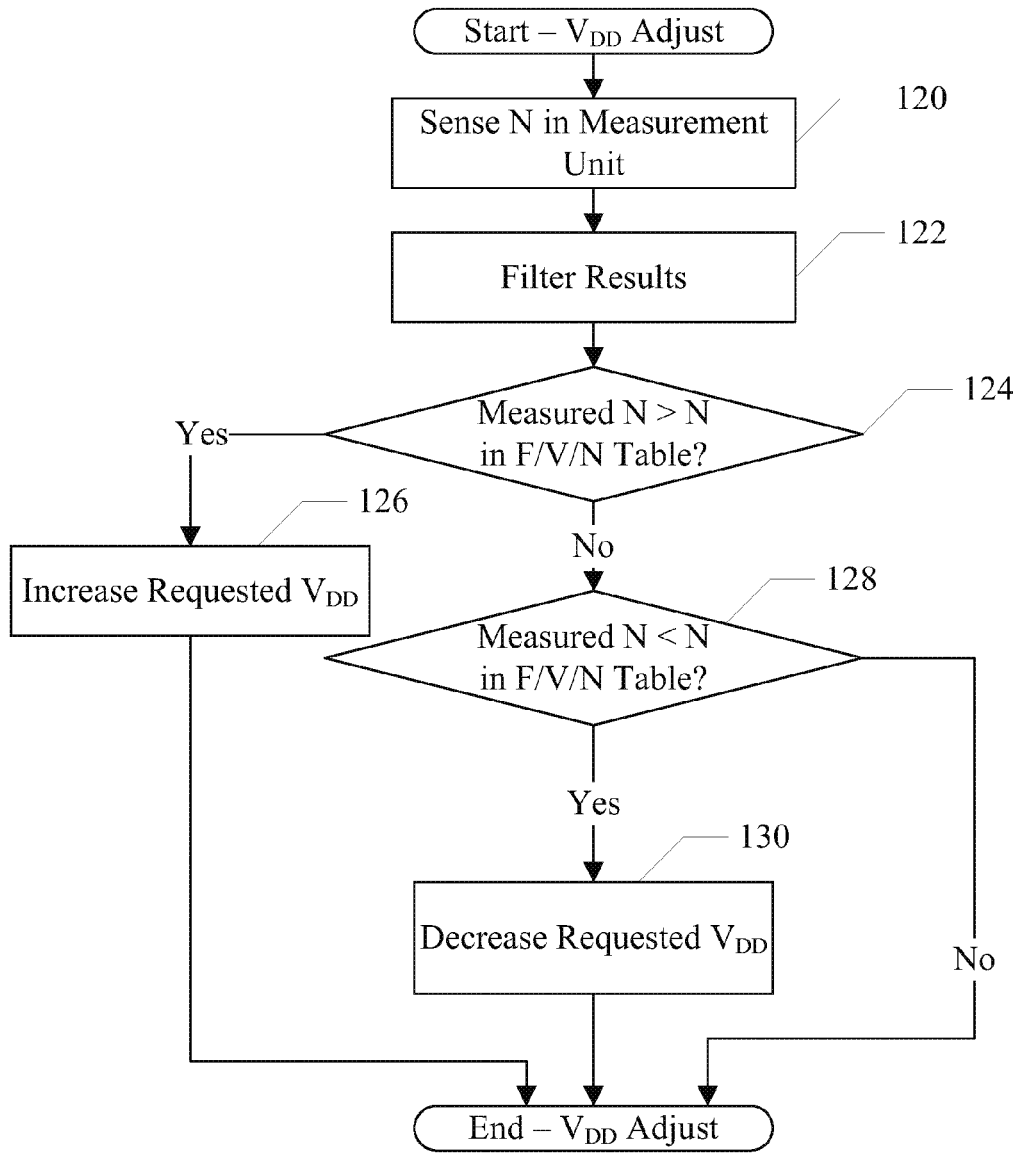
FIG. 8 is a flowchart illustrating operation of one embodiment of the integrated circuit to request a supply voltage.

Turning now to FIG. 8, a flowchart is shown illustrating operation of one embodiment of the integrated circuit 10 as shown in FIG. 6 (and more particularly the measurement unit 100 and the local power manager 18) to determine if the supply voltage magnitude is to be adjusted. The operation of FIG. 8 may be performed periodically while the integrated circuit 10 is in operation (e.g. approximately once every 10 microseconds to 1 millisecond, in one embodiment, depending on the thermal inertia of the system). The operation of FIG. 8 may be performed after a change in workload (e.g. from a phone to a music player or a mobile internet access device). The operation of FIG. 8 may be performed as part of changing the frequency of operation, as well. The blocks are shown in a particular order for ease of understanding, but other orders may be used. Blocks may be performed in parallel by combinatorial logic within the measurement unit 100/local power manager 18. Blocks, combinations of blocks, and/or the flowchart as a whole may be pipelined over multiple clock cycles.

The local power manager 18 may activate the measurement unit 100, which may sense the current propagation delay ("N") in the series connection of gates 104A-104H (block 120). In some embodiments, the local power manager 18 and/or the measurement unit 100 may filter the results (block 122). Specifically, for example, the filtering may include detecting oscillation of the value of N between consecutive measurements. The oscillation may occur because the propagation delay is close an integer number of clock cycles (and thus is sometimes captured in M clock cycles and other times is captured in M+1 clock cycles). The oscillation may also occur because the requested supply voltage is being increased and decreased in an oscillatory manner.

If the measurement unit 100 detects that the measured "N" is greater than the "N" from the F/V/N table 102 (decision block 124, "yes" leg), the local power manager 18 may increase the requested supply voltage magnitude sent to the PMU/power supply 12 (block 126). For example, the next higher supply voltage magnitude may be requested. If the measurement unit 100 detects that the measured "N" is less than the "N" from the F/V/N table 102 (decision block 128, "yes" leg), the local power manager 18 may decrease the requested supply voltage magnitude sent to the PMU/power supply 12 (block 130). The operation of FIG. 8 may be repeated until the requested supply voltage magnitude settles, or may be repeated at the next measurement time, as desired.

Figure 9:
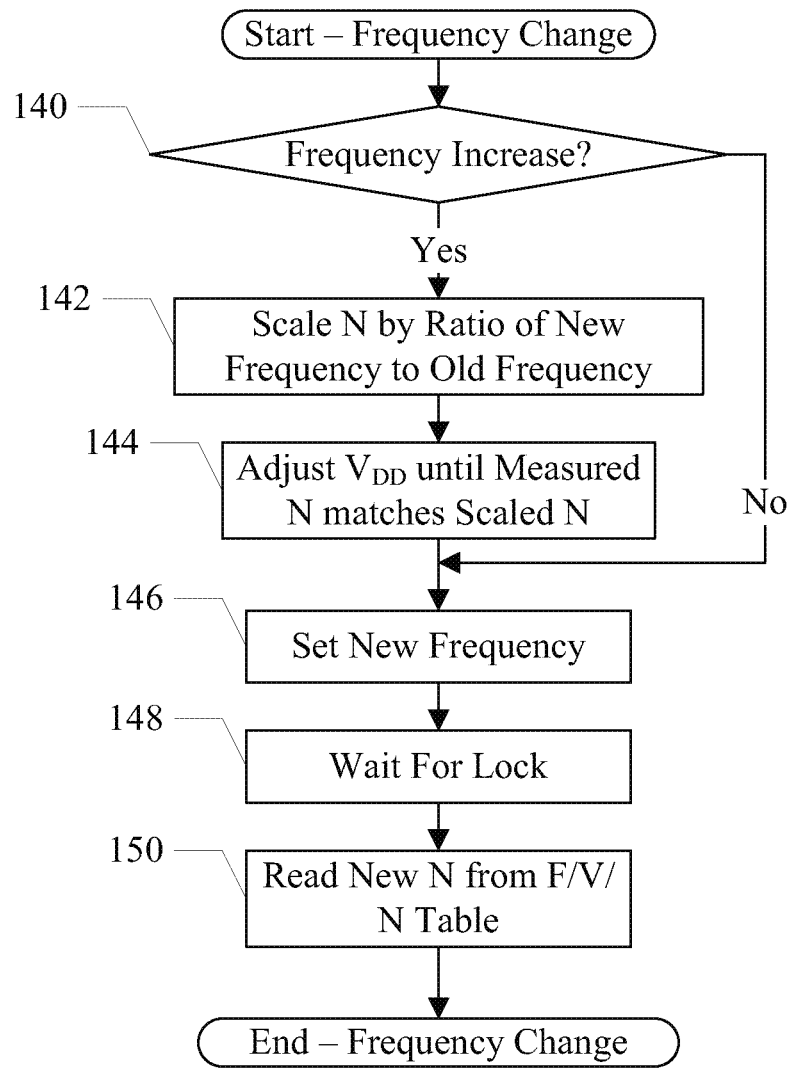
FIG. 9 is a flowchart illustrating operation of one embodiment of the integrated circuit shown in FIG. 6 to change a frequency of operation of the integrated circuit.

Turning now to FIG. 9, a flowchart is shown illustrating operation of one embodiment of the integrated circuit 10 (and more particularly the local power manager 18 and the measurement unit 100) in response to a request to change frequencies in the integrated circuit 10. The blocks are shown in a particular order for ease of understanding, but other orders may be used. Blocks may be performed in parallel by combinatorial logic within the measurement unit 100/local power manager 18. Blocks, combinations of blocks, and/or the flowchart as a whole may be pipelined over multiple clock cycles.

If the request to change frequencies is an increase from the current operating frequency (decision block 140, "yes" leg), the value of N in the flop 106 may be scaled by the ratio of the new (requested) frequency and the old (current frequency) (block 142). For example, if the current frequency is 1 GHz and the new frequency is 1.5 GHz, the value of N may be scaled by 1.5. The local power manager 18 and the measurement unit 100 may iterate the adjust supply voltage process of FIG. 8 until the measured N from the measurement unit 100 matches the scaled N (block 144). In some embodiments, a margin may be added to the scaled N to ensure that the increased supply voltage magnitude is sufficient to support the newly changed frequency. Once the scaled N is met, the local power manager 18 may set the new frequency (block 146) and may wait for the clock generation circuit to lock to the new frequency (block 148). A new N may be read from the F/V/N table 102 and may be written to the flop 106 (block 150).

If the request to change frequencies is a decrease from the current operating frequency (decision block 140, "no" leg), the local power manager 18 may set the new frequency (block 146) without scaling N and adjusting the supply voltage (blocks 142 and 144). Since the supply voltage is already high enough to support the higher current frequency, the integrated circuit 10 will operate at the new frequency correctly. Subsequent periodic measurements and adjustments (e.g. FIG. 8) may lower the voltage. In other embodiments, N may be scaled and the voltage may be adjusted (blocks 142 and 144) for the lower new frequency as well, in which case the adjustments to the supply voltage will be reductions.

In some embodiments, the process of adjusting the supply voltage magnitude (block 144) may begin with reading the supply voltage magnitude from the F/V/N table 102 (or the self calibration table 22) for the new frequency and initializing the process by requesting the supply voltage magnitude from the table.

Figure 10:
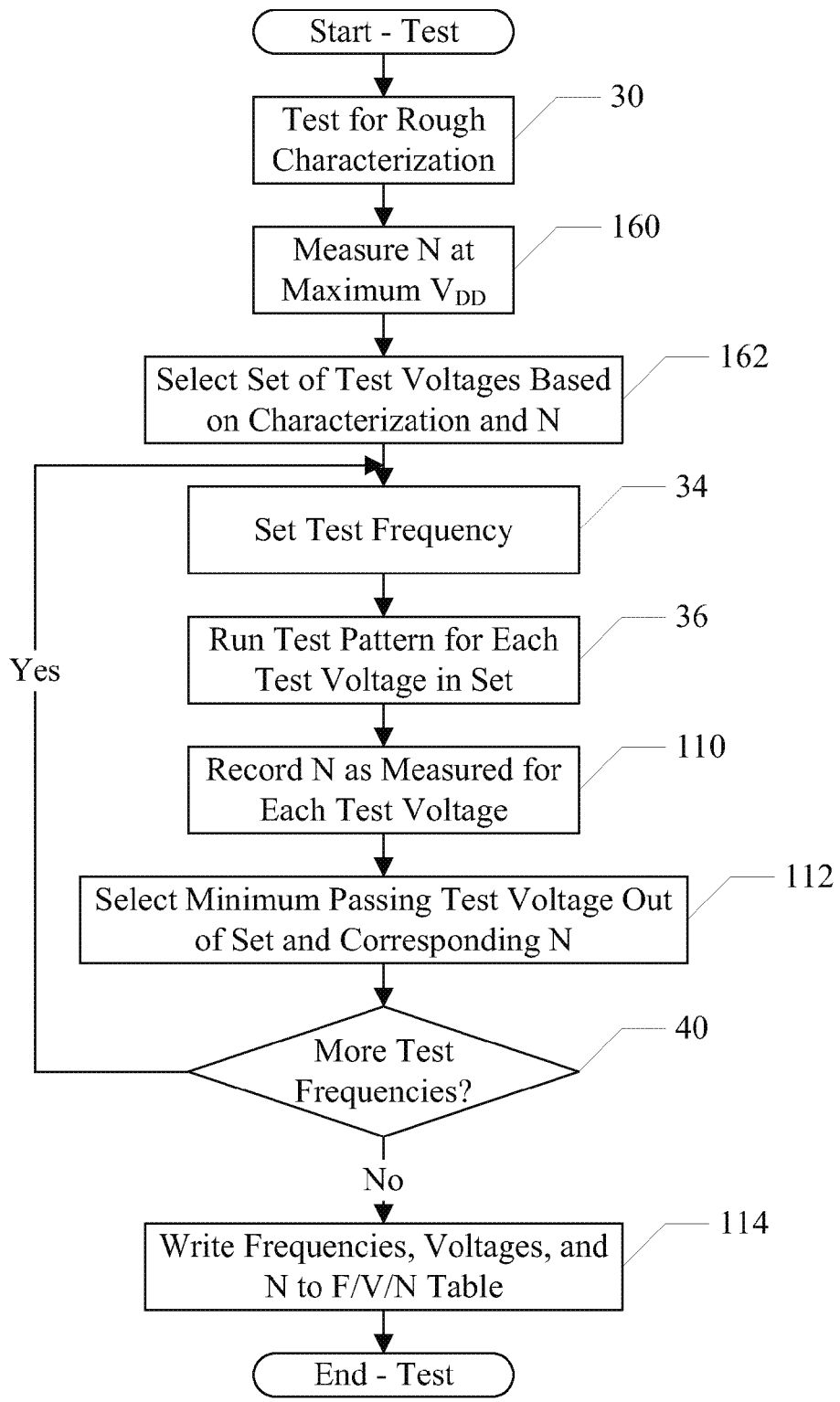
FIG. 10 is a flowchart illustrating another embodiment of a test of the integrated circuit shown in FIG. 6.

Turning next to FIG. 10, a flowchart is shown illustrating another embodiment of testing integrated circuit 10 as shown in FIG. 6 prior to packaging the integrated circuit. The blocks shown in FIG. 10 may be performed on a test machine (e.g. a wafer tester) during the manufacture of the integrated circuit 10.

Figure 13:
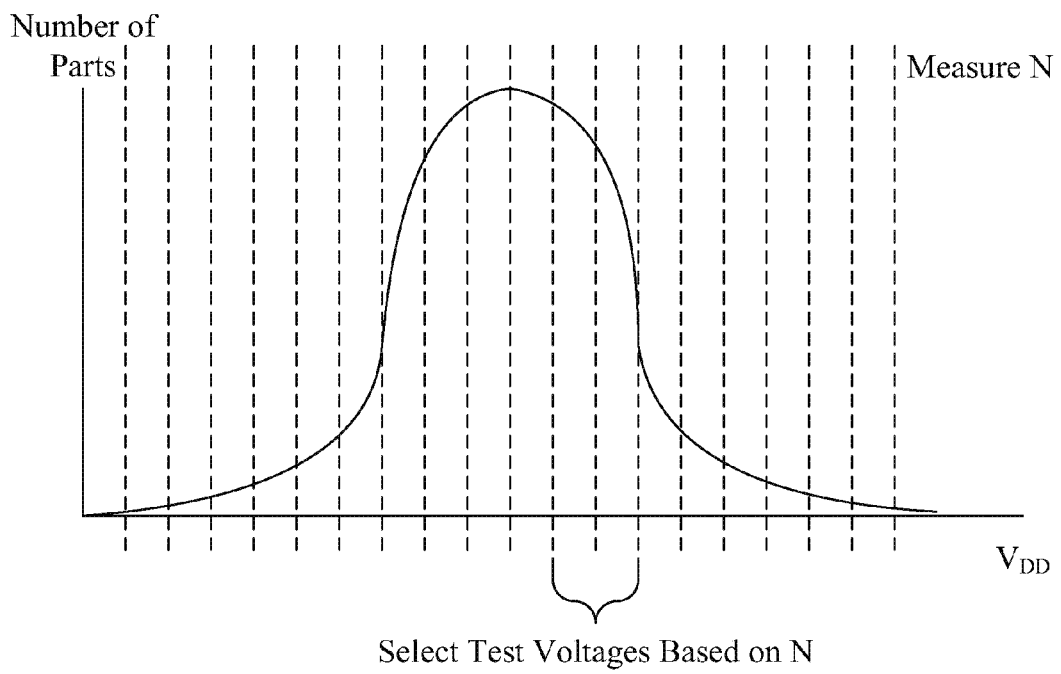
FIG. 13 is a graphical representation of the number of parts that are operable at various supply voltages and the test voltages that may be used in another embodiment of testing the integrated circuit.

Similar to the embodiment of FIG. 2, the test may begin by testing for a rough characterization of the integrated circuit 10 (block 30), such as $I_{ddq}$ testing. Additionally, the measurement unit 100 may be activated with the supply voltage set to its maximum possible value (per the specification of integrated circuit 10) (block 160). The measurement of N at the maximum possible value may be an indication of the "speed" of the integrated circuit 10, and may be used to select a set of test voltages (block 162). In this fashion, the selected test voltages may be closer to the optimal voltage for a given frequency, which may permit fine grain voltage testing in a short amount of test time and resulting supply voltage magnitude that is close to the optimum value for the integrated circuit 10. Accordingly, the integrated circuit 10 may consume less power at a given frequency when the supply voltage is set to the voltage in the table (as compared to less optimal test strategies). Additionally, a relatively small set of voltages may still be used, reducing test time. For example, FIG. 13 is a graphical representation of the distribution of parts from fast process (left side of FIG. 13) to slow process (right side of FIG. 13). Using the maximum voltage (dotted line farthest to the right), N may be measured. Based on the measured N, a small set of test voltages near the expected operating point may be selected and the integrated circuit 10 may be tested at these voltages (brace at the bottom of FIG. 13).

Subsequently, similar to the embodiment of FIG. 7, set the first test frequency (block 34), and may run a test pattern for each voltage in set of test voltages as the supply voltage (block 36). The test may include activating the measurement unit 100. For each test voltage, the tester may read the number of clock cycles of delay "N" as measured by the measurement unit 100 during the test (that is, the value in the counter flop 108). The tester may record the measured N for each test voltage (block 110). The tester may then select the minimum supply voltage magnitude for which the test passes, as well as the corresponding "N" (block 112).

If there are more test frequencies (e.g. more supported operating frequencies for the integrated circuit 10 that have not yet been tested—decision block 40, "yes" leg), the next frequency may be selected and tested (blocks 34, 36, 110, and 112). The set of test voltages may include different voltages to be tested for each supported operating frequency, or may be selected so that at least one passing supply voltage is expected for each supported operating frequency. Once the test frequencies have been exhausted (decision block 40, "no" leg), the test machine may write the frequencies, voltage magnitudes, and values of "N" to the F/V/N table 102 (block 114).

In some embodiments, a margin may be added to the measured "N" to be written to the table. Alternatively, the margin may be added to "N" read from the table to write "N" to the flop 106. Similarly, a margin may be added to the supply voltage magnitude written to the table or the margin may be added by the local power manager 18 after reading the magnitude from the table.

Figure 11:
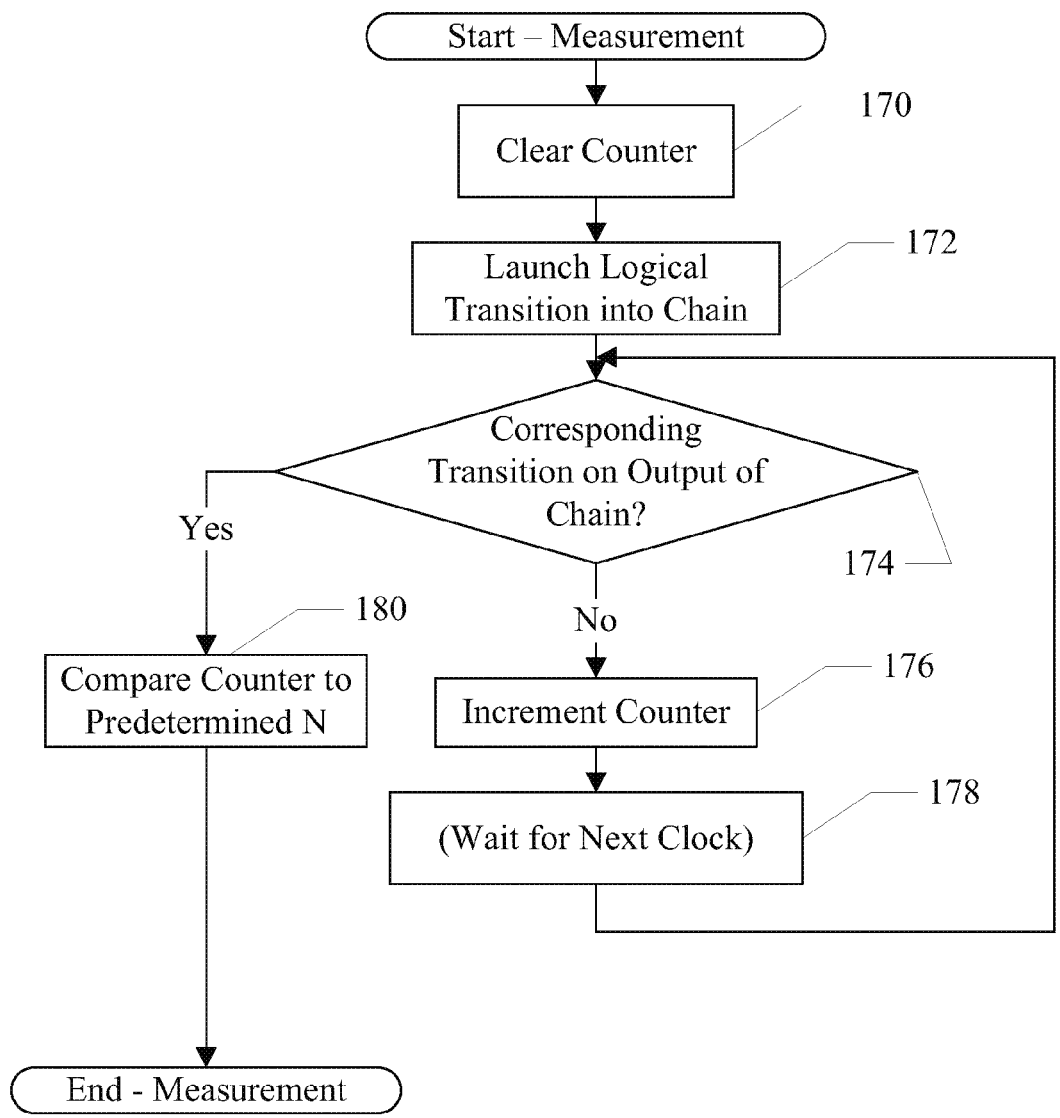
FIG. 11 is a flowchart illustrating operation of one embodiment of a speed/temperature compensation unit shown in FIG. 6.

Turning next to FIG. 11, a flowchart is shown illustrating operation of one embodiment of the measurement unit 100 to perform a measurement. The measurement unit 100 may perform the operation illustrated in FIG. 11 in response to the local power manager 18 initiating a measurement, for example. The blocks are shown in a particular order for ease of understanding, but other orders may be used. Blocks may be performed in parallel by combinatorial logic within the measurement unit 100. Blocks, combinations of blocks, and/or the flowchart as a whole may be pipelined over multiple clock cycles.

The measurement unit 100 may clear the counter in the flop 108 (reference numeral 170), and may launch a logical transition into the series connection (or "chain") of gates 104A-104H (block 172). If the measurement unit 100 has not yet detected the corresponding logical transition at the output of the chain (decision block 174, "no" leg), the measurement unit 100 may increment the counter (block 176) and wait for the next clock cycle to detect the transition again (block 178). If the measurement unit 100 has detected the corresponding transition (decision block 174, "yes" leg), the measurement unit 100 may compare the counter to N in the flop 106 and report the results to the local power manager 18 (block 180).

Numerous variations and modifications will become apparent to those skilled in the art once the above disclosure is fully appreciated. It is intended that the following claims be interpreted to embrace all such variations and modifications.

What is claimed is:

1. A method comprising:
performing a characterization of an integrated circuit at a first supply voltage magnitude;
responsive to a result of the characterization, selecting a subset of a plurality of test supply voltage magnitudes, wherein the subset excludes at least one of the plurality of test supply voltage magnitudes;
testing the integrated circuit at each of the test supply voltage magnitudes in the subset, wherein the testing is performed at a first clock frequency of the integrated circuit;
determining a minimum supply voltage magnitude of the subset at which the testing is successful; and
storing an indication of the minimum supply voltage magnitude in the integrated circuit for use during operation of the integrated circuit at the first clock frequency, wherein the integrated circuit includes a self calibration unit configured to reduce a supply voltage magnitude below the minimum supply voltage at the first clock frequency responsive to self calibration testing during use.

2. The method as recited in claim 1 wherein performing the characterization comprises measuring a current in the integrated circuit while the integrated circuit is quiescent.

3. The method as recited in claim 2 wherein the first supply voltage magnitude is a maximum supported supply voltage magnitude for the integrated circuit.

4. The method as recited in claim 1 further comprising:
powering the integrated circuit with a supply voltage having the minimum supply voltage magnitude;
performing a plurality of iterations of the self calibration by the self calibration unit, each of the plurality of iterations at successively lower supply voltage magnitudes than the minimum supply voltage magnitude;
responsive to the plurality of iterations of self calibration, selecting a calibrated supply voltage magnitude that is lower than the minimum supply voltage magnitude; and
operating the integrated circuit at the calibrated supply voltage and the first clock frequency.

5. The method as recited in claim 4 further comprising:
storing an indication of the calibrated supply voltage magnitude in the integrated circuit; and
using the calibrated supply voltage in a subsequent powering of the integrated circuit, whereby the self calibration unit is not active in the subsequent powering of the integrated circuit.

6. The method as recited in claim 5 wherein storing the indication of the calibrated supply voltage magnitude comprises writing the indication to a volatile memory in the integrated circuit.

7. The method as recited in claim 1 wherein storing the indication of the minimum supply voltage magnitude comprises writing the indication to a table.

8. The method as recited in claim 7 wherein writing the indication comprises selectively blowing fuses that form the table.

9. An integrated circuit comprising:
a logic circuit;
a local power manager coupled to the logic circuit and configured to transmit an indication of a requested supply voltage magnitude to an external power supply;
a table coupled to the local power manager and configured to store a list of operating frequencies and supply voltage magnitudes, wherein the supply voltage magnitude for each operating frequency is determined during test of the integrated circuit based on a characterization and a test of a subset of a plurality of test supply voltage magnitudes; and a self calibration unit within the integrated circuit and configured to execute a test on the logic circuit;

wherein the local power manager is configured to power the integrated circuit at a selected operating frequency using a corresponding power supply voltage magnitude from the table, and wherein the self calibration unit is configured to iterate the test at respectively lower requested supply voltage magnitudes compared to the corresponding power supply voltage magnitude, and wherein the local power manager is configured to use a lowest requested supply voltage magnitude at which the test passes to determine a first requested supply voltage magnitude for operation of the integrated circuit at the selected operating frequency.

10. The integrated circuit as recited in claim 9 further comprising a self calibration table configured to store a list of operating frequencies and corresponding second supply voltage magnitudes determined by the self-calibration unit, wherein the local power manager is configured to request the first requested supply voltage magnitude for the selected operating frequency responsive to the self calibration table.

11. The integrated circuit as recited in claim 10 wherein the self calibration unit is configured to write the first requested supply voltage magnitude as the corresponding second supply voltage magnitude to the self calibration table for the selected operating frequency responsive to determining the lowest requested supply voltage magnitude.

12. The integrated circuit as recited in claim 10 wherein the local power manager is configured to activate the self calibration unit responsive to detecting that the self calibration table does not have a valid entry for the selected operating frequency.

13. The integrated circuit as recited in claim 10 wherein the local power manager is configured not to activate the self calibration unit responsive to detecting that the self calibration table does have a valid entry for the selected operating frequency.

14. A method comprising:
detecting a request in an integrated circuit to change from a first operating frequency to a second operating frequency;
reading an entry in a self calibration table, wherein the entry is associated with the second operating frequency; and
responsive to detecting that the entry is not storing a valid supply voltage magnitude, activating a self calibration unit to determine a supply voltage magnitude for the second operating frequency.

15. The method as recited in claim 14 further comprising:
setting a requested supply voltage magnitude to a magnitude read from a second table responsive to detecting that the entry in the self calibration table is not storing the valid supply voltage magnitude;
iterating a test in the self calibration unit, wherein the requested supply voltage magnitude is reduced for each iteration until a test failure results;
determining a lowest requested supply voltage magnitude at which the test passes; and
writing a corresponding supply voltage magnitude to the entry.

16. The method as recited in claim 15 wherein the corresponding supply voltage magnitude is derived from the lowest requested supply voltage magnitude by including margin above the lowest requested supply voltage magnitude.

17. The method as recited in claim 14 further comprising:
detecting a second request in an integrated circuit to change from the second operating frequency to a third operating frequency;
reading a second entry in the self calibration table, wherein the second entry is associated with the third operating frequency; and
responsive to detecting that the second entry is storing a valid supply voltage magnitude, not activating the self calibration unit.

18. The method as recited in claim 17 further comprising:
requesting the valid supply voltage magnitude from the second entry; and
switching to the third operating frequency.

19. An integrated circuit comprising:
a logic circuit;
a local power manager coupled to the logic circuit and configured to transmit an indication of a requested supply voltage magnitude to an external power supply;
a self calibration unit within the integrated circuit and configured to execute a test on the logic circuit;
a self calibration table coupled to the local power manager and configured to store a list of operating frequencies and supply voltage magnitudes, wherein the supply voltage magnitude for each operating frequency is determined by the self calibration unit iteratively executing the test at lower requested supply voltage magnitudes during use; and
wherein the local power manager is configured to detect a request for a change from a first operating frequency to a second operating frequency, and wherein the local power manager is configured to selectively activate the self calibration unit responsive to whether or not a valid supply voltage magnitude is stored in the self calibration table for the second operating frequency.

20. The integrated circuit as recited in claim 15 wherein the self calibration unit, when activated, is configured to: set the requested supply voltage magnitude to a magnitude read from a second table responsive to detecting that the entry in the self calibration table is not storing the valid supply voltage magnitude; iterate a test, wherein the requested supply voltage magnitude is reduced for each iteration until a test failure results; determine a lowest requested supply voltage magnitude at which the test passes; and write a corresponding supply voltage magnitude to the entry.

* * * * *